(12) United States Patent
Miyauchi et al.

(10) Patent No.: US 8,358,132 B2
(45) Date of Patent: *Jan. 22, 2013

(54) IRRADIATING COIL AND MAGNETIC RESONANCE IMAGING APPARATUS USING THE SAME

(75) Inventors: Yoshiaki Miyauchi, Matsudo (JP); Shizuka Nagai, Kashiwa (JP); Atsushi Ohta, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/231,285

(22) Filed: Sep. 13, 2011

(65) Prior Publication Data

US 2012/0004532 A1     Jan. 5, 2012

Related U.S. Application Data (63) Continuation of application No. 12/062,935, filed on Apr. 4, 2008, now Pat. No. 8,134,367, which is a continuation of application No. 10/451,910, filed as application No. PCT/JP01/11567 on Dec. 27, 2001, now Pat. No. 7,382,130.

(30) Foreign Application Priority Data

Dec. 27, 2000   (JP) .................................. 2000-397769
Jan. 30, 2001   (JP) .................................. 2001-21988

(51) Int. Cl.
   *G01V 3/00*     (2006.01)
(52) U.S. Cl. .......................... 324/318; 324/322; 600/411

(58) Field of Classification Search .......... 600/407–420; 324/306–309, 318–322
See application file for complete search history.

(56) References Cited

U.S. PATENT DOCUMENTS

| | | | |
|---|---|---|---|
| 5,041,790 | A | 8/1991 | Tropp et al. |
| 5,202,635 | A | 4/1993 | Srinivasan |
| 5,565,780 | A | 10/1996 | Derby |
| 5,721,490 | A | 2/1998 | Takano et al. |
| 6,320,383 | B1 | 11/2001 | Kato et al. |
| 6,344,745 | B1 | 2/2002 | Reisker |
| 6,633,161 | B1 | 10/2003 | Vaughan |
| 6,710,598 | B2 | 3/2004 | Leussler |
| 2006/0033501 | A1 | 2/2006 | Vaughan |

FOREIGN PATENT DOCUMENTS

| | | |
|---|---|---|
| DE | 100 56 807 | 5/2002 |
| JP | 06-051044 | 5/1994 |
| JP | 7-255699 | 10/1995 |
| JP | 08-252237 | 10/1996 |
| JP | 8-280652 | 10/1996 |
| JP | 11-9570 | 1/1999 |
| JP | 2000-166896 | 6/2000 |
| JP | 2004-513718(T) | 5/2004 |
| WO | WO 02/41020 | 5/2002 |

*Primary Examiner* — Sanjay Cattungal
(74) *Attorney, Agent, or Firm* — Antonelli, Terry, Stout & Kraus, LLP.

(57) ABSTRACT

An irradiating coil includes a first ring conductor located on a plane, a second ring conductor having a smaller diameter than a diameter of the first ring conductor and located substantially on the plane of the first ring conductor, a plurality of first line conductors connected the first ring conductor and to the second ring conductor, and an arrangement for making uniform a radio-frequency-pulse that is transmitted by the irradiating coil. The pulse uniforming arrangement includes a diverger which diverges a current flow of the first line conductors.

17 Claims, 11 Drawing Sheets

IRRADIATING COIL AND MAGNETIC RESONANCE IMAGING APPARATUS USING THE SAME

CROSS REFERENCE TO RELATED APPLICATION

This application is a Continuation application of U.S. patent application Ser. No. 12/062,935, filed on Apr. 4, 2008 now U.S. Pat. No. 8,134,367, which is a Continuation application of U.S. patent application Ser. No. 10/451,910, filed Dec. 10, 2003 now U.S. Pat. No. 7,382,130, which is a National Stage Entry of PCT/JP01/11567, filed Dec. 27, 2001, and claims priority from Japanese Patent Application Nos. JP 2000-397769, filed Dec. 27, 2000, and JP 2001-21988, filed on Jan. 30, 2011, the contents of which are incorporated herein by reference.

FIELD OF THE INVENTION

The present invention relates to a magnetic resonance imaging apparatus of the type that creates an image of desired portions of an object to be examined; and, more particularly, the invention relates to an irradiating coil in such an apparatus for applying a radio-frequency pulse to the object.

BACKGROUND OF THE INVENTION

A magnetic resonance imaging apparatus (hereinafter referred to as an MRI apparatus) is designed to measure the concentration distribution and the relaxation time distribution of nuclear spins at a desired portion to be examined within an object to be examined, utilizing the nuclear magnetic resonance phenomenon, and to display an image of a cross section of the object obtained from the obtained data.

The nuclear spins of an object, which is placed within an apparatus for generating a uniform and strong magnetic field, perform precession at a frequency (Lamor frequency) determined by the magnetic field strength around an axis in the direction of the magnetic field. When a radio-frequency pulse having a frequency equivalent to the Larmor frequency is irradiated to the object from the outside, the nuclear spins are excited and shift to a higher energy state (nuclear magnetic resonance phenomenon). When the radio-frequency pulse irradiation to the object is terminated, the nuclear spins return to a low energy state at a time constant in accordance with their respective states, and they radiate electromagnetic waves (NMR signal) to the outside of the object. The electromagnetic waves are detected by a radio-frequency receiving coil, which is synchronized with their frequency.

Here, gradient magnetic fields on x-, y-, and z-axes are applied to the magnetic field space so as to add positional information to the NMR signals. Consequently, the positional information within the space can be obtained as frequency information.

For radio-frequency pulse irradiation, an irradiating coil is used which generates a radio-frequency magnetic field in a direction perpendicular to the static magnetic field direction. This irradiating coil has been researched and modified to obtain an improvement of the irradiation uniformity over a wide area in the magnetic field space, and various types of coils have been used.

Figure 1:
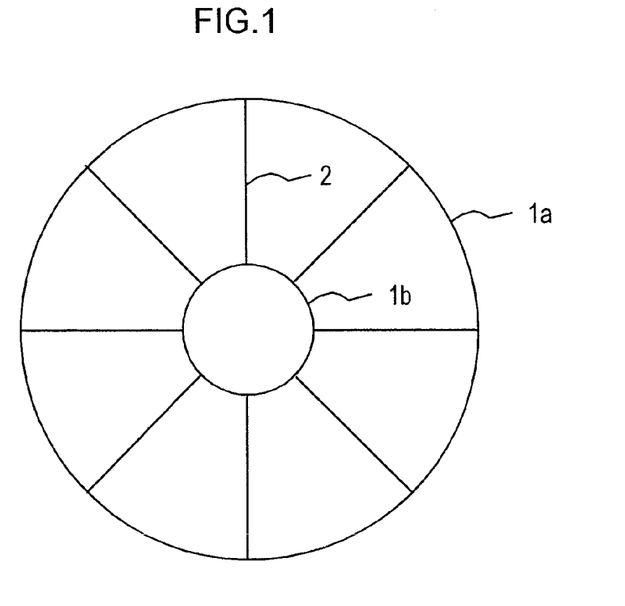
FIG. 1 is a diagram of the structure of a conventional birdcage coil.

FIG. 1 is a diagram showing one example of an irradiating coil, wherein an example of a planar birdcage coil is shown. Referring to FIG. 1, two concentric ring conductors 1a and 1b having different sizes on the same plane are mutually connected by a plurality of line conductors 2, extending in the radial direction.

Figure 2:
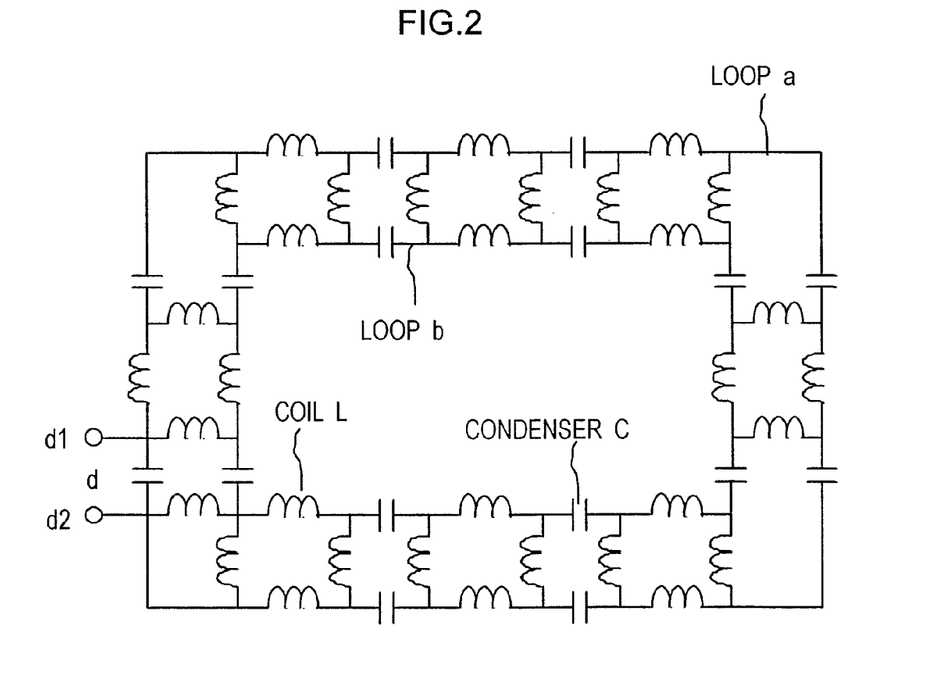
FIG. 2 is a schematic circuit diagram of a conventional planar birdcage coil.

FIG. 2 is an equivalent circuit diagram of the planar birdcage coil. Referring to FIG. 2, a loop a and a loop b designate the ring conductor 1a and the ring conductor 2a, respectively. The loop a and the loop b are usually synchronized at a magnetic resonance frequency. For the synchronization, condensers C and coils L are used.

Figure 3:
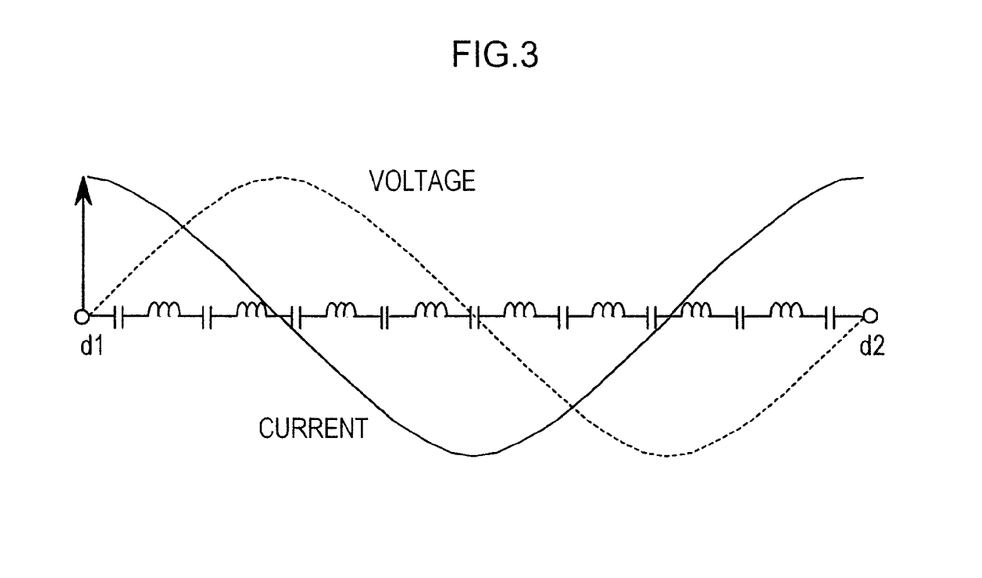
FIG. 3 is a diagram of the operating potential and current of a birdcage coil.

FIG. 3 is a diagram showing the voltage distribution and current distribution in the loop a shown in FIG. 2. Referring to FIG. 3, the current is maximized and the voltage is minimized at the feeding points d, since the loop a is synchronized at the resonance frequency.

Figure 4:
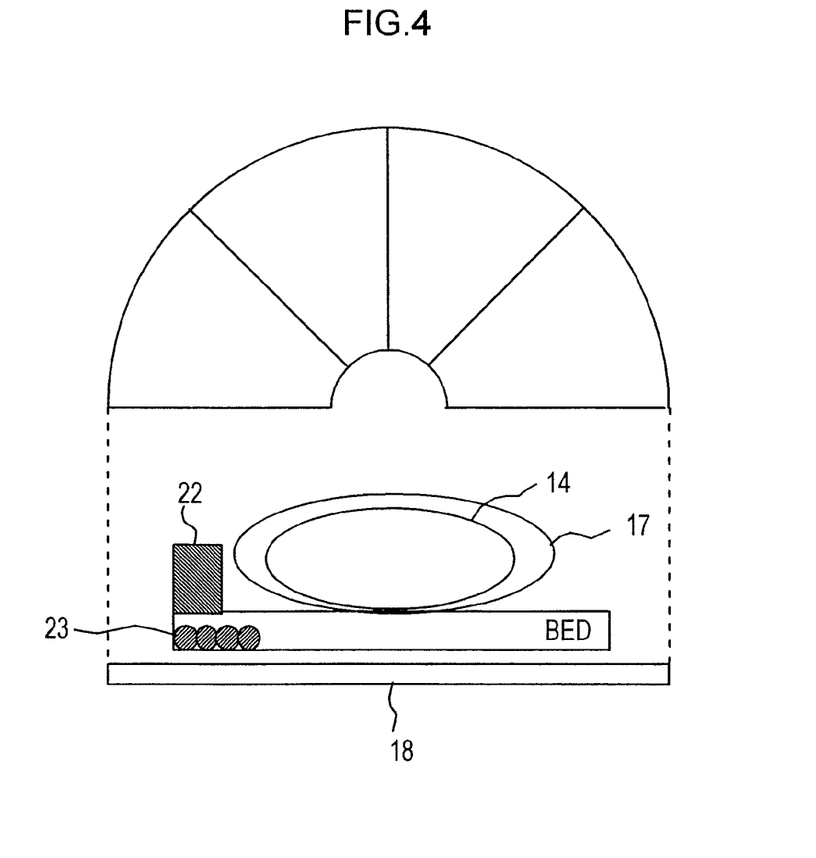
FIG. 4 is a schematic cross-sectional view of a birdcage coil and its periphery.

FIG. 4 is a diagram showing one example of the irradiating planar birdcage coil shown in FIG. 1, which is mounted in an MRI apparatus. Referring to FIG. 4, an irradiating coil 18 is usually located in the vicinity of an object 14 to be examined so as to efficiently apply an irradiation pulse to the object 14. Around the object 14, there are arranged a receiving coil 17 for receiving magnetic resonance signals that are generated from the object 14, a pre-amplifier 22 for amplifying the received signals, distribution lines 23 for connecting the signals that are amplified by the pre-amplifier 22 to an ND converter (not shown), and the like, which are usually mounted in a bed on which the object 14 is supported. The receiving coil 17, the pre-amplifier 22, and the distribution lines 23 may be arranged in one location, for ease of manufacturing and operationality.

Figure 5:
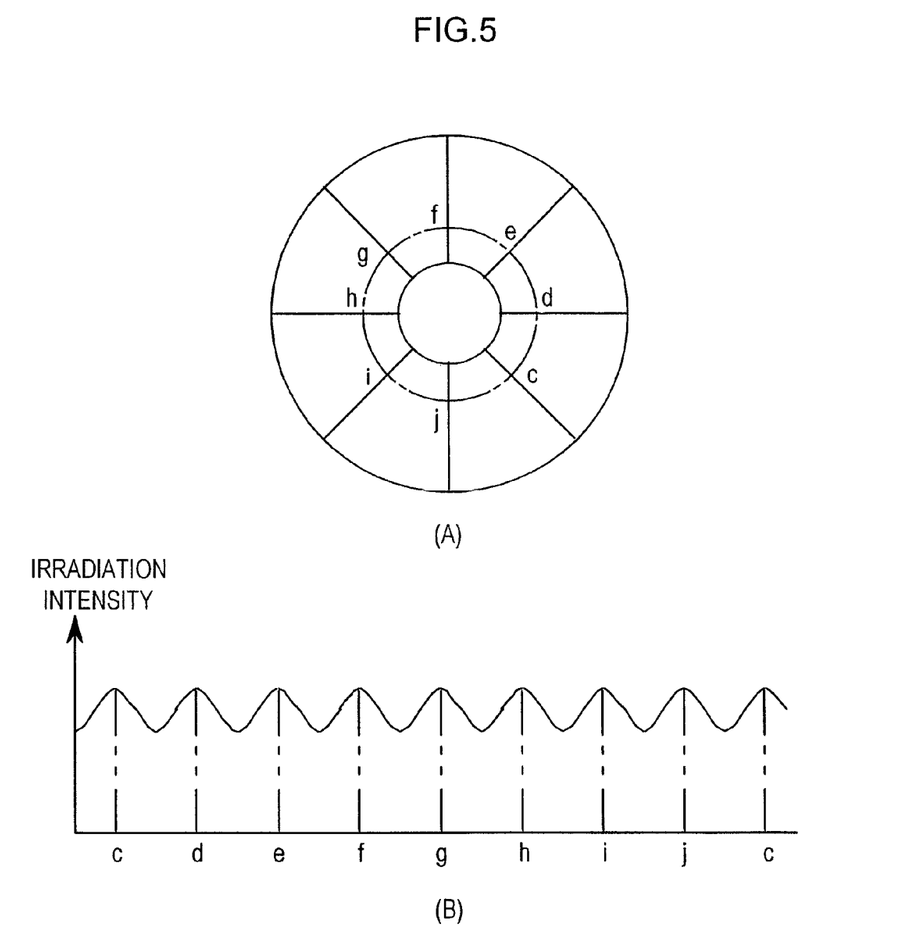
FIG. 5(A) is a diagram of a birdcage coil.
FIG. 5(B) is a graph of the irradiation sensitivity distribution of the planer birdcage coil of FIG. 5(A) according to the conventional technique.

FIG. 5(B) is a graph showing an intensity distribution of radiation that is applied to the object, the intensity having been measured at arbitrary points (c, d, e, f, g, h, i, and j, along the phantom line circle in FIG. 5(A)) on the line conductors 2 of the above-mentioned planar birdcage coil. In FIG. 5(B), the vertical axis represents the irradiation intensity, and the horizontal axis represents locations along the phantom line circle. As shown in FIG. 5(B), the irradiation intensity is larger on the line conductors 2 than in the space between the line conductors 2, and it has a pulse shape that is pulsing with a uniform width.

As shown in FIG. 4, in the MRI apparatus, imaging is performed while the object 14, on which the receiving coil 17 is placed, is mounted on the bed. The pre-amplifier 22, for amplifying the signals sent from the receiving coil 17, and the distribution lines 23 are installed in the bed.

To adjust the location of the object 14 so as to image a particular portion, the bed is constructed so that it can be moved. However, the positional relation between the pre-amplifier 22, the distribution lines 23 and the irradiating coil 18 is changed by moving the bed, since the pre-amplifier 22 and the distribution lines 23 are installed in the bed. Consequently, a potential difference is generated between the potential of the receiving coil 17, the pre-amplifier 22, and the distribution lines 23, and that of the irradiating coil 18, and so a radio-frequency coupling is generated. The strength of the radio-frequency coupling fluctuates when the positional relation is changed, since the positional relation affects the potential difference.

Figure 6:
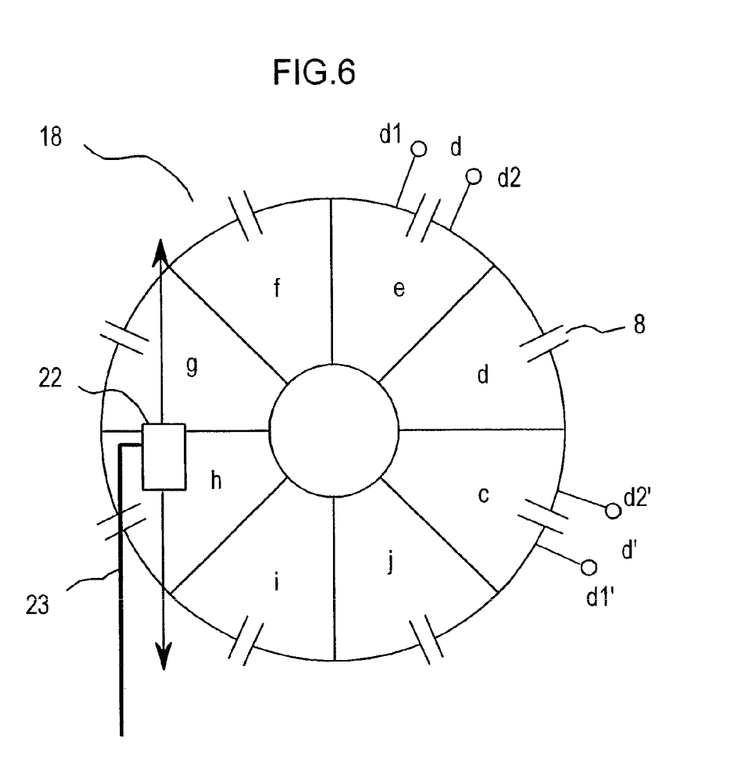
FIG. 6 is a schematic diagram of a birdcage coil and a pre-amplifier causing interference on the periphery thereof.

Next, the fluctuation of the radio-frequency coupling will be described with reference to FIG. 6. Referring to FIG. 6, the irradiating coil 18 operates as a QD coil. Here, reference number 8 represents a condenser C in the circuit diagram of FIG. 2, and it is located where the voltage is maximized in FIG. 3.

Usually, in a QD coil, one feeding point does not affect a resonant circuit of another feeding point, since the two feeding points are perpendicularly arranged. However, as shown in FIG. 4, when only one side of the irradiating coil is subject to radio-frequency coupling due to the effect of the distribution lines 23 (in FIG. 6, the pre-amplifier 22 and the distribution lines 23 are arranged as shown) or the like, the pre-amplifier 22 and the distribution lines 23 are located where the potential of the irradiating coil 18 is high. In this case, radio-frequency coupling between the pre-amplifier 22, the distribution lines 23, and the irradiating coil 18 is caused to fluctuate with fluctuation of the positional relation between the pre-amplifier 22 and the distribution lines 23.

Figure 7:
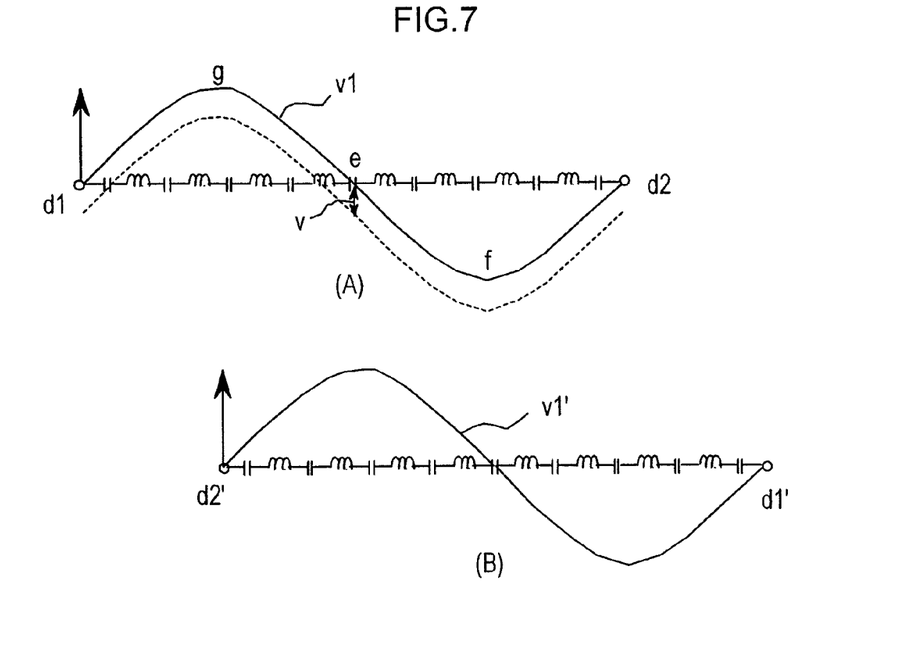
FIG. 7 is a diagram of the potential shift in the case where the relative position of a pre-amplifier or the like and a birdcage coil is shifted.

Next, this fluctuation of the potential will be described with reference to FIG. 7. FIG. 7 shows a voltage that is generated in resonant circuits d and d' in FIG. 6. The respective voltage distributions of circuits d and d' are indicated by the v1 and v1' solid lines in ideal conditions. The potential of v1' at a point where the potential of v1 is highest (or lowest) is the base potential, and this prevents radio-frequency coupling. However, when the object 14 is moved, or the bed is moved, the pre-amplifier 22 and the distribution lines 23 are moved relative to the irradiating coil 18. They are moved to a location where the potential of the resonant circuit d is the highest, whereby the potential is shifted as shown in FIG. 7 (represented by the broken line). Consequently, the location where the potential of d is a base potential is shifted from the point e, whereby fluctuation of a potential difference between d and d' is generated. Consequently, the orthogonality of the QD coils d and d' between d and d' is lost, and a radio-frequency coupling is generated between them.

An error in the phase of the radio-frequency magnetic field generated from the two coils of the QD coil occurs, varying from 90 degrees due to the above-described radio-frequency coupling, and, consequently, the uniformity of the radiation pulse and the irradiation efficiency are deteriorated. However, in the conventional technique, consideration for the radio-frequency coupling between the irradiating coil 18 and the distribution lines 23 in the vicinity thereof has not been given.

Also, in the planar birdcage coil, line conductors 2 are radially arranged between the two ring conductors 1a and 1b, which have different sizes. Consequently, the irradiation intensity is large in the vicinity of the central portion close to the ring conductor 1b, since the distance between two line conductors is narrow. On the contrary, the irradiation intensity is small on the periphery close to the ring conductor 1a, since the distance between two line conductors is broad. That is, the irradiation intensity distribution is lower where the line conductors 2 are farther from the ring conductor 1b, whereby the overall irradiation distribution is not uniform. Therefore, when imaging a relatively large object, the sensitivity in the portions other than the central portion in the obtained image is lower, in comparison with the central portion.

Thus, in the conventional technique, consideration to provide a uniform irradiation pulse has not been given.

SUMMARY OF THE INVENTION

The present invention is made in consideration of the above-described circumstances, and the main object thereof is to further improve the image quality of an MRI image.

Another object of the invention is to provide an irradiating coil that can lower the proportion of radio-frequency coupling between an irradiating coil and distribution lines or the like, improve the irradiation uniformity and the irradiation efficiency, and produce a good-quality image, and an MRI apparatus using such an irradiating coil.

A further object of the invention is to provide a birdcage coil that can improve the sensitivity of the obtained image by irradiating a radio-frequency pulse which is uniform over the area to be imaged, and an MRI apparatus using such a birdcage coil.

Specifically, the irradiating coil in a typical example of the present invention includes a first ring conductor, a second ring conductor having a smaller diameter than that of the first ring conductor, and a plurality of first line conductors connecting the first ring conductor and the second ring conductor, wherein means for causing a uniform irradiation pulse to be transmitted by the irradiating coil is provided on the first ring conductor or on the first line conductors.

This means for causing a uniform irradiation pulse to be transmitted may have a plurality of resonant capacitance elements on the first ring conductor between each of the first line conductors. Alternately, it may have a resonant capacitance element on the first ring conductor between each of the first line conductors, and also have a plurality of resonant capacitance elements in a space between two specific line conductors. Further, means may be provided for lowering the potential at a position shifted by 90 degrees from a feeding position, to which the radio-frequency signal for transmitting an irradiation pulse is supplied.

Further, the means for causing a uniform irradiation pulse to be transmitted may include a diverging means for diverging current that is transmitted to the first line conductors, which may have second line conductors that are connected perpendicular to the first line conductors and third line conductors for connecting both ends of the second line conductors and the second ring conductor. This means may also be constructed such that the second line conductors are connected to the approximate center of the first line conductors at right angles. It may also be constructed such that the length of the third line conductors and the distance from the second ring conductor to the connecting point of the second line conductors to the first line conductors are substantially equal. Further, it may be constructed such that the second line conductors are connected to the first line conductors two-thirds of the length of the first line conductors from the second ring conductor at right angles.

Further, the diverging means may include at least one resonant capacitance element connected between each of the third line conductors. It may also include fourth line conductors that are connected between the first line conductors and the second ring conductor perpendicular to the first line conductors, both ends of which are connected to the third line conductors. It may also include a resonant capacitance element on the first line conductors between each of the second line conductors and the first ring conductor. It may also include fifth line conductors that are connected between the second line conductors and the third line conductors at a predetermined angle.

Further, the first ring conductor may consist of straight-line segments between each of the first line conductors, and the second ring conductor also may consist of straight-line segments between the each of the first line conductors. Means for diverging the operating voltage may also be included. Further, the irradiating coil may include a first ring conductor, a second ring conductor having a smaller diameter than that of the first ring conductor, a plurality of first line conductors that are connected to the circumferences of the first and second ring conductors so as to equally divide the circumference of the first and the second ring conductors, second line conductors extending in the circumferential direction of the first and the second ring conductors, and at least one third line conductor connecting each end of the second line conductors and the second ring conductor.

Further, an MRI apparatus, in one typical example of the present invention, includes a magnetic circuit for applying a static magnetic field to an object to be examined; gradient magnetic field coils for applying to the object a slicing magnetic field, a readout gradient magnetic field, and an encoding gradient magnetic field; an irradiating coil for applying an irradiation pulse that generates magnetic resonance in the object; a receiving coil for detecting a magnetic resonance signal; and an image reconstructing means for obtaining an image of the object using the signal detected by the receiving coil, wherein the irradiating coil has a first ring conductor, a second ring conductor having smaller diameter than that of the first ring conductor, a plurality of first line conductors for connecting the first ring conductor and the second ring conductor, and means for causing the irradiation pulse to be uniform.

BEST MODE FOR CARRYING OUT THE INVENTION

Hereinafter, various embodiments of the present invention will be described in detail with reference to the drawings.

Figure 8:
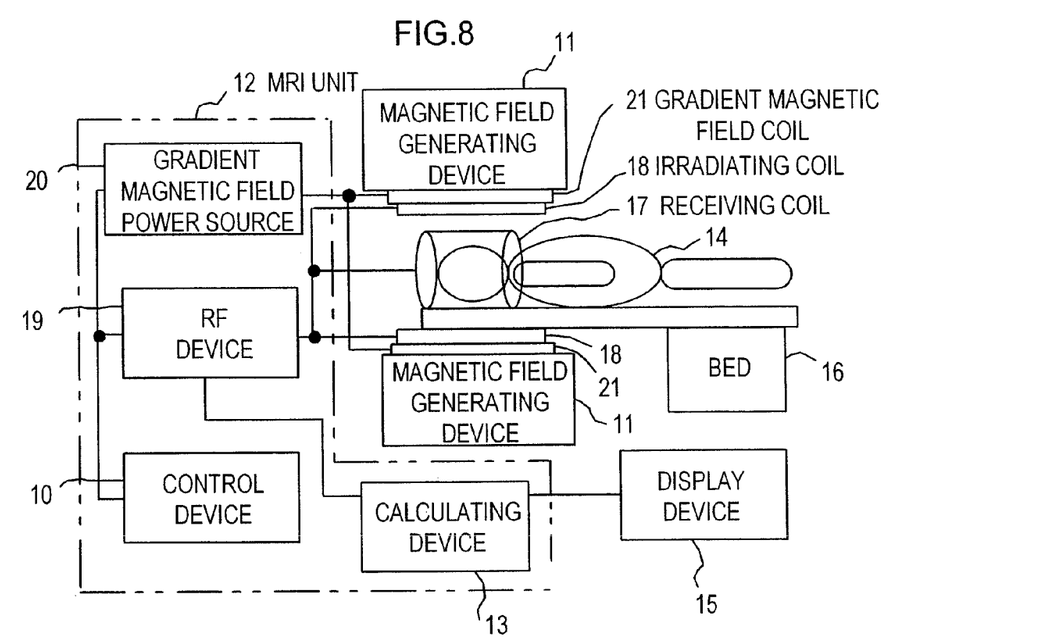
FIG. 8 is a schematic block diagram of an MRI apparatus according to the present invention.

FIG. 8 is a block diagram of an MRI apparatus according to the present invention. Referring to FIG. 8, the MRI apparatus, which is designed to obtain a tomogram of an object 14 to be examined utilizing nuclear magnetic resonance (NMR), includes a magnetic field generating device 11, an MRI unit 12, gradient magnetic field coils 21, irradiating coils 18, receiving coils 17, a bed 16, and a display device 15.

The gradient magnetic field generating device 11 is designed to generate a strong and uniform static magnetic field towards the object. Magnetic field generating means of a permanent magnet type or of a superconductive type is installed in the space around the object 14. A magnetic field generating device 11 of the vertical magnetic field type is preferably employed, but magnetic field generating devices 11 of the horizontal magnetic field type can also be used.

The MRI unit 12 includes a control unit 10 for controlling various pulse sequences in imaging, a high-speed image data calculating device 13, a gradient magnetic field power source 20, and a radio-frequency device 19.

Three pairs of the gradient magnetic field coils 21 are located respectively on an x-axis, a y-axis, and a z-axis, and they form the necessary gradient magnetic fields around the object 14 with output current of the gradient magnetic field power source 20 that is controlled by the control unit 10, thus adding positional information to NMR signals. The radio-frequency device 19 irradiates to the object 14 a radio-frequency pulse for exciting nuclear spins in accordance with control by the control device 10. NMR signals generated by nuclear spin excitation are detected by the receiving coils 17, and they are collected by the radio-frequency device 19. These signals are subject to image-reconstruction calculation and the like at the calculating device 13 and are made into an MRI image, which is displayed by the display device 15.

Next, the irradiating coils 18, according to a first embodiment of the invention, will be described with reference to FIG. 9. Each of the irradiating coils 18 includes a ring conductor 3, a ring conductor 5 having smaller diameter than that of the ring conductor 3, and line conductors 4 connected at even intervals along the circumferences of each of the ring conductor 3 and the ring conductor 5. The ring conductor 3 and the ring conductor 5 are thus mutually connected.

The number of line conductors 4 is eight in this embodiment, but it needs to be 4n (n is a natural number) when a quadrature transmission (QD transmission) system is used. Usually, the number of line conductors 4 is selected from among four, eight, and sixteen. However, the invention can also be applied to an irradiation coil including sixteen or more line conductors 4.

Resonant capacitance elements 8 are serially arranged on the circumference of the ring conductor 3 between the respective line conductors 4. Similarly, resonant capacitance elements (not shown) are also arranged serially on the circumference of the ring conductor 5 between the respective line conductors, and thus the irradiating coil is constructed.

Here, radio-frequency signals of the radio-frequency device 19 are provided to a feeding point 30 and a feeding point 31 of the irradiating coil 18. A plurality of resonant capacitance elements are serially arranged at the positions where the voltage is highest when viewed from the feeding points 30 and 31 (a position turned 90 degrees, which is a position where resonant capacitance elements 32 and 33 are arranged). In FIG. 9, the resonant capacitance 32 (33) has three resonant capacitance elements, but any plural number of resonant capacitance elements that form the resonant capacitance 32 (33) is acceptable.

Figure 9:
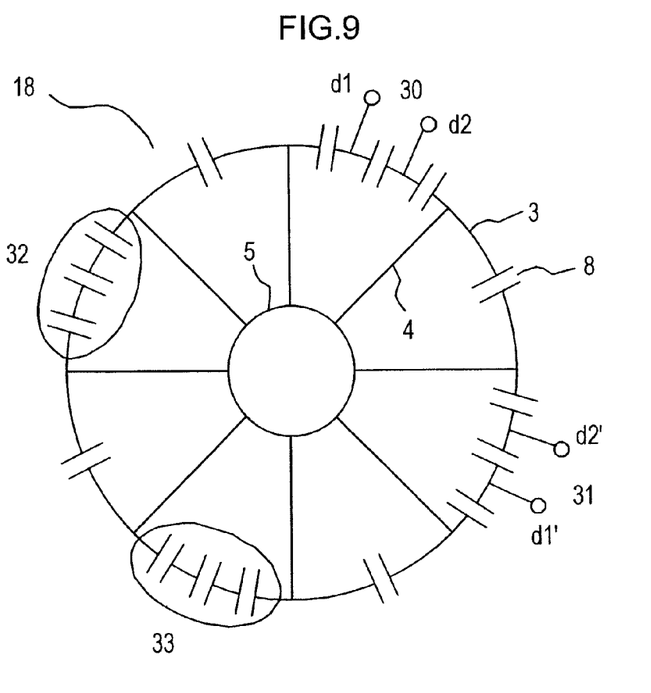
FIG. 9 is a diagram of the structure of a planar birdcage coil according to a first embodiment of the present invention.
Figure 10:
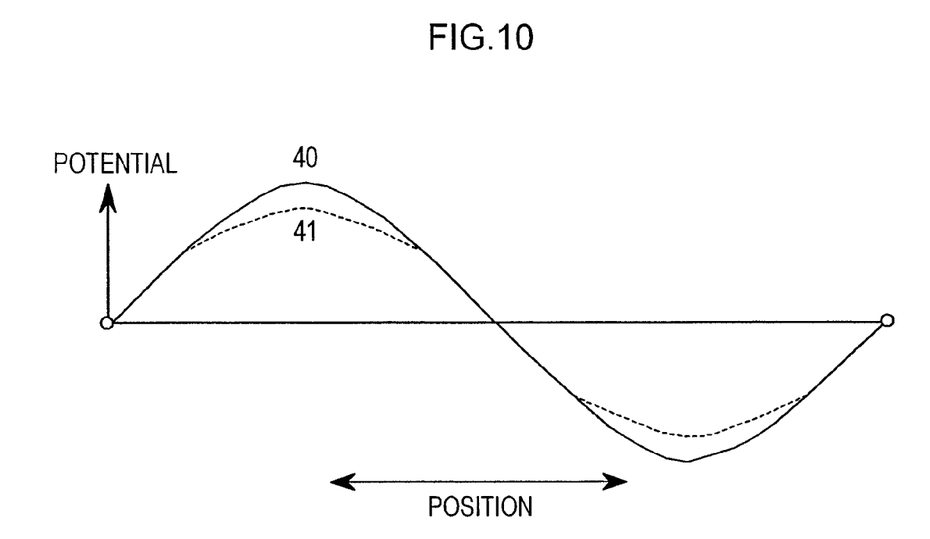
FIG. 10 is a potential graph of a planar birdcage coil according to a first embodiment of the present invention.

FIG. 10 is a graph showing the potential at positions of the irradiating coils shown in FIG. 9. In FIG. 10, the waveform 41 of the potential (broken line), in the case where the resonant capacitance 32 is formed of a plurality of condensers, fluctuates more gently than the waveform 40 of potential (solid line), in the case where the resonant capacitance 32 is formed of one condenser, whereby the resonant capacitance 32 that is formed of plural condensers can reduce the fluctuation of radio-frequency coupling among the pre-amplifier 22, the distribution lines 23 and the like in the arrangement of FIG. 4. That is, even if the relative positions of the pre-amplifier 22, the distribution lines 23 and the irradiating coil 18 are changed, causing the potential 41 to fluctuate, since the waveform of the potential 41 is gentle, the potential fluctuation thereof at the point e, for example, is smaller than the potential 40.

Next, a second embodiment of the present invention will be described in detail with reference to FIG. 11 to FIG. 13.

Figure 11:
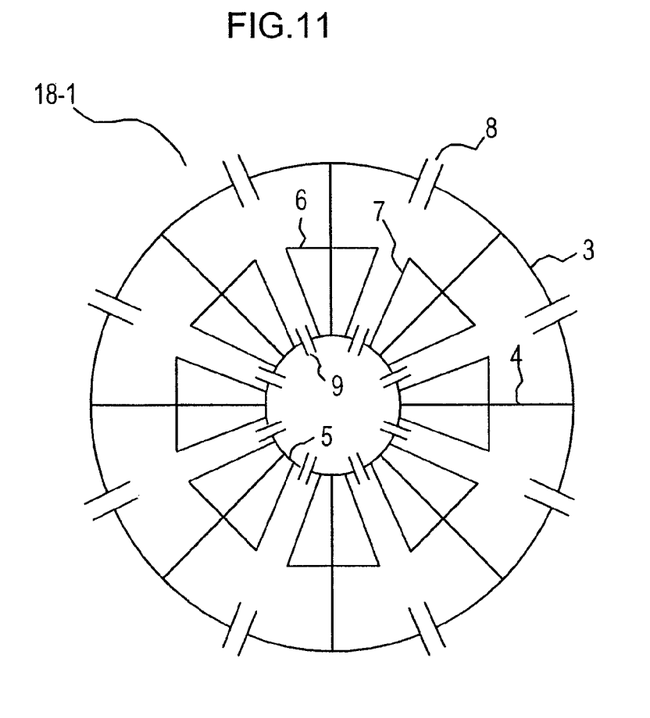
FIG. 11 is a schematic diagram of the structure of a birdcage coil according to a second embodiment of the present invention.

Referring to FIG. 11, an irradiating coil 18-1 includes a ring conductor 3, a ring conductor 5 having smaller diameter than the ring conductor 3, and a plurality of line conductors 4 connected at points along the circumferences of the ring conductor 3 and of the ring conductor 5, in the same manner as in the first embodiment. The number of the line conductors 4 is eight, similar to the first embodiment. This number needs to be 4n (n is a natural number) when a quadrature transmission (QD transmission) system is used. The number of the line conductors 4 preferably is four, eight, or sixteen.

Resonant capacitance elements 8 are serially connected along the circumference of the ring conductor 3 between the respective line conductors 4. Similarly, resonant capacitances 9 are also connected serially along the circumference of the ring conductor 5 between the respective line conductors 4. The irradiating coil 18-1 is thus constructed. In addition, line conductors 6 are connected to arbitrary positions on the line conductors 4 so as to intersect with the line conductor 4 at right angles. Each end of the line conductors 6 is connected to the ring conductor 5 by a line conductor 7. In FIG. 11, the number of line conductors 7 is two, but the invention is not limited thereto. As the number of the line conductors 7 is increased, the uniformity of the irradiation intensity is further improved. However, one to three is appropriate.

FIGS. 12(A) and 12(B) show the intensity distribution of radiation applied to the object measured at arbitrary positions on the line conductors 4 of the irradiating coil 18-1 (along the dashed line circle). FIG. 12(B) shows the irradiation intensity distribution along the phantom line in FIG. 12(A). The solid line in FIG. 12(B) shows the irradiation intensity distribution in the case where the irradiation coil of the second embodiment is employed, and the broken line in FIG. 12(B) shows the irradiation intensity distribution in the case where the irradiation coil of the conventional technique (one without the line conductors 6 and 7) is employed.

By connecting a plurality of the line conductors 7 to the line conductors 4 via the line conductors 6, the current transmitted to the line conductors 4 is diverged to the line conductors 7 and the distribution of the generated radio-frequency magnetic field can be made further uniform, whereby the irradiation intensity can be made more uniform.

That is, when comparing the case where the current transmitted to the line conductors 4 is diverged to the line conductors 7 (actual line in FIG. 12(B)) with the case where the current transmitted to the line conductors 4 is not diverged (broken line in FIG. 12(B)), the value of the current transmitted to each conductor at positions along the dashed line in FIG. 12(A) is smaller and the irradiation intensity is also smaller, when the current is diverged in comparison with the case where the current is not diverged. However, since the intervals between each conductor are lessened, a drop in the irradiation intensity at the spaces between conductors is also reduced.

Consequently, the difference between the maximum and the minimum of the irradiation intensity is smaller when the current is diverged than when it is not diverged, and, therefore, the uniformity of the irradiation intensity can be improved.

Next, an irradiating coil 18-2, that is made by extending the length of the line conductors 7 of the irradiating coil 18-1, will be described as a variation of the second embodiment, with reference to FIG. 13.

Figure 12:
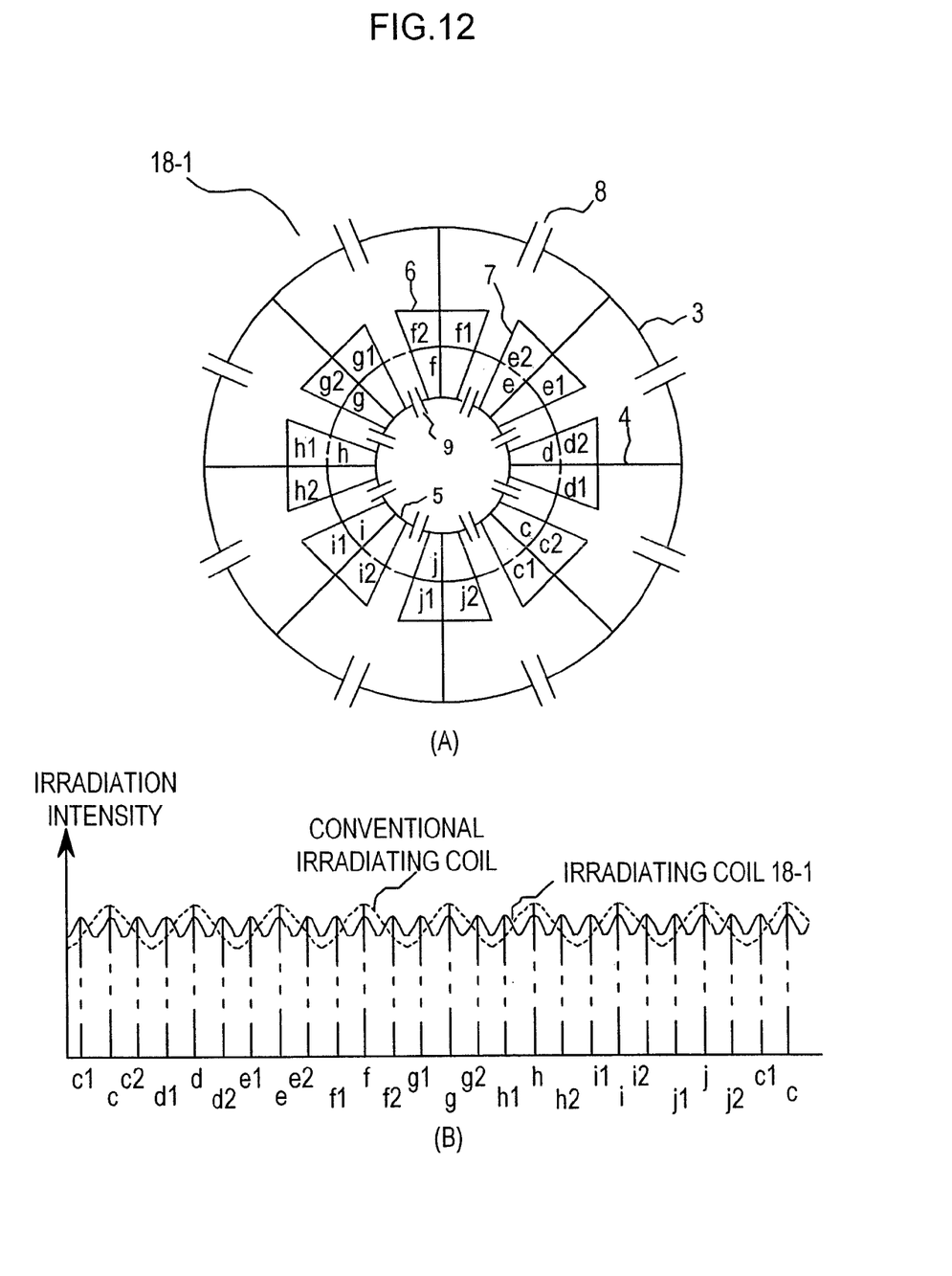
FIG. 12(A) is a diagram of a birdcage coil.
FIG. 12(B) is a graph of the irradiation sensitivity distribution of the planar birdcage coil of FIG. 12(A) according to the second embodiment of the present invention.

In the irradiating coil 18-1 in FIG. 12, the line conductors 6 are connected to the approximate center of the line conductors 4, and the length of the line conductors 7 are about half of that of the line conductors 4. On the other hand, in the irradiating coil 18-2 in FIG. 13, the line conductor 6-1 are connected at a point about two-thirds along the length of the line conductors 4 from the ring conductor 5 with the smaller diameter, and the length of the line conductors 7-1 is thus about two-third of that of the line conductors 4.

FIG. 13(B) shows the irradiation intensity distribution of the line conductors 4 of the irradiation coil 18-2 measured where the line conductors 4 pass a circle of arbitrary radius, wherein the radiation intensity distribution of the irradiating coil 18-2 is represented by the actual line, and that of the irradiating coil 18-1, shown in FIG. 12, is represented by a broken line.

Figure 13:
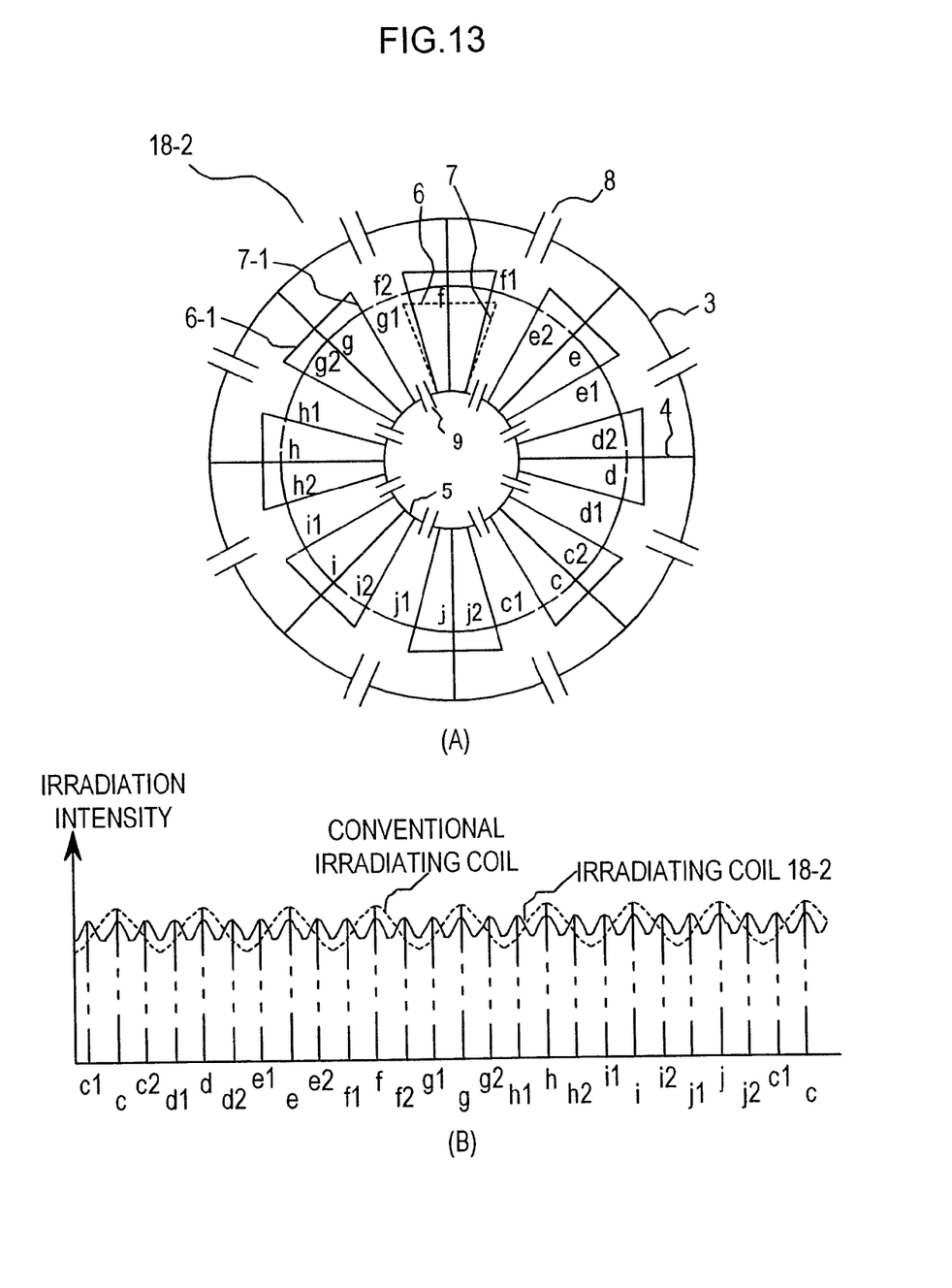
FIG. 13(A) is a schematic diagram of an improved birdcage coil according to the second embodiment of the present invention.
FIG. 13(B) is a graph of the irradiation sensitivity distribution of the birdcage coil of FIG. 13(A)

As is clear from FIG. 13(B), the range of fluctuation of the irradiation intensity of the irradiating coil 18-2 at this circle, which is further removed from the center, is smaller than that of the irradiating coil 18-1. That is, when using the irradiating coil 18-2 shown in FIG. 13, the uniform irradiation intensity area can be further expanded in comparison with that when using the irradiating coil 18-1.

As described above, the length of the line conductors 7 and 7-1 can be set when manufacturing the coil according to diagnostic functions and the performance desired for the MRI apparatus.

According to the second embodiment, the current transmitted to the line conductors 4 is more evenly distributed on the plane of the coil, since the current is diverged to the line conductors 7 (7-1). Consequently, the uniformity of the irradiation intensity is improved. Therefore, a birdcage coil that can uniformly transmit a radio-frequency pulse in the area to be imaged can be realized, and an MRI apparatus with improved sensitivity in the obtained image can be realized.

Figure 14:
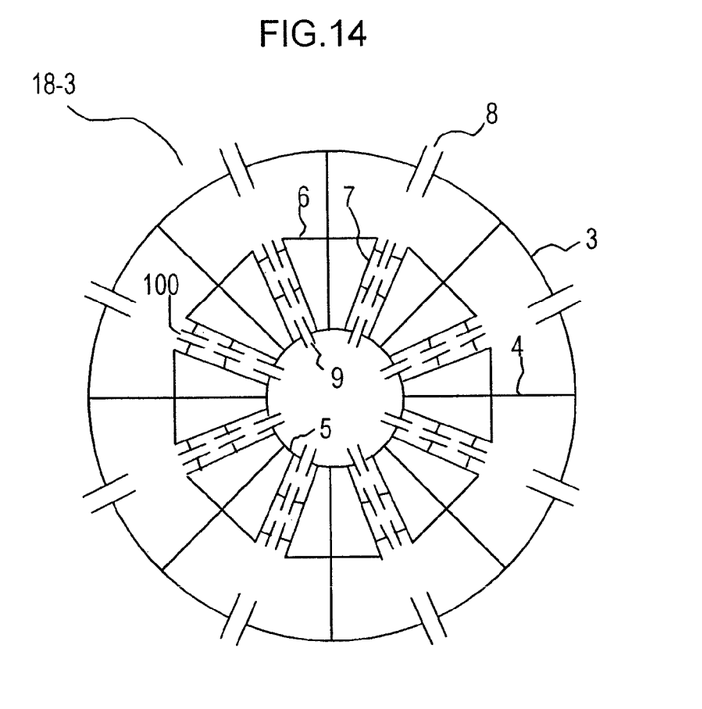
FIG. 14 is a schematic diagram of a planar birdcage coil according to a third embodiment of the present invention, wherein resonant capacitance elements are distributed.

Next, a third embodiment of the present invention will be described with reference to FIG. 14 and FIG. 15. In the third embodiment, resonant capacitance elements 100 are connected between line conductors 7 (7-1) of the irradiating coil 18-1 (18-2) in the second embodiment, and the irradiating coil 18-3 is thus constructed.

Figure 15:
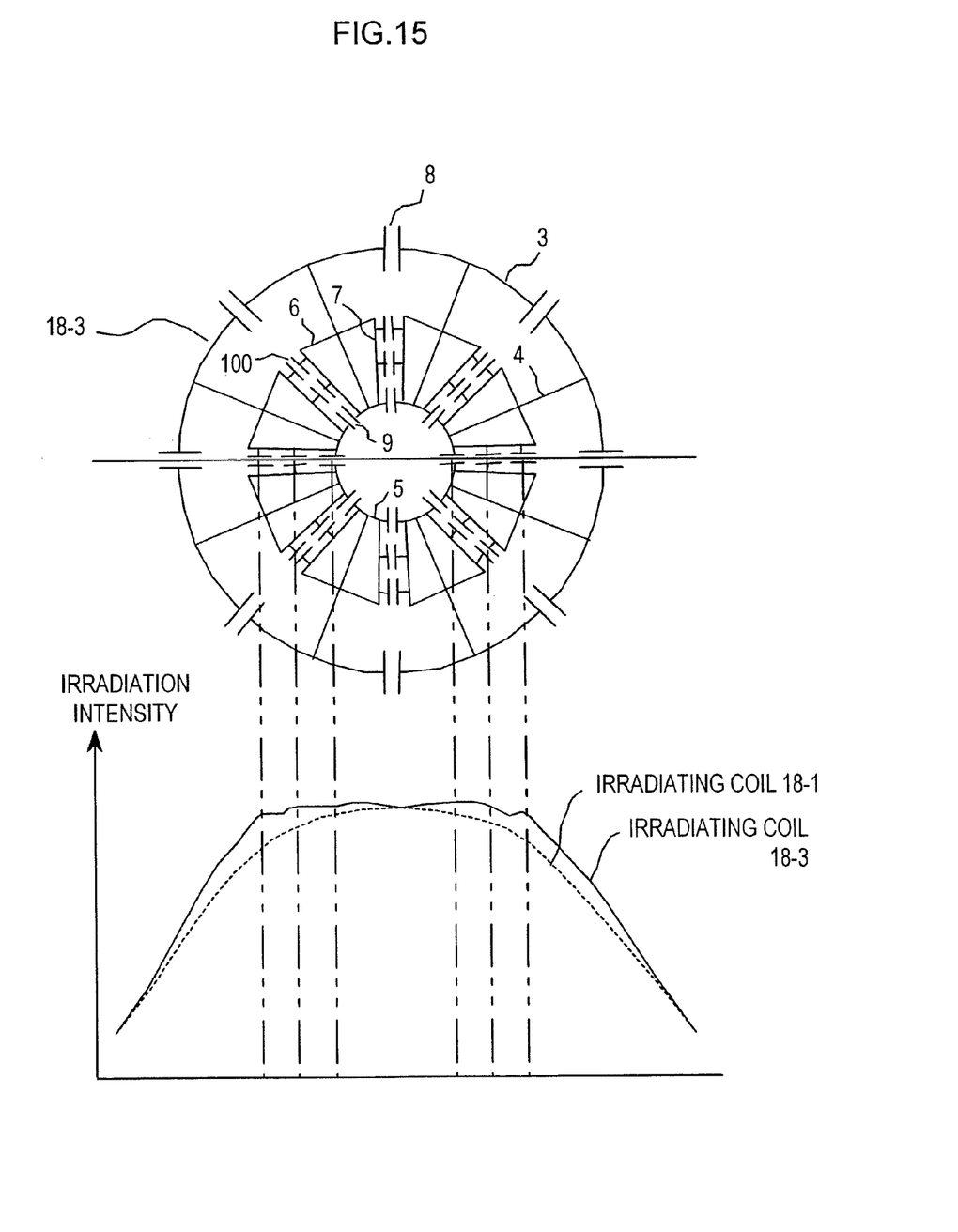
FIG. 15 is a graph of the irradiation sensitivity distribution of a planar birdcage coil according to the third embodiment of the present invention.

FIG. 15 shows the irradiation intensity distribution on a line that passes through the resonant capacitance elements 100 that are distributed between the line conductors 7 of the irradiating coil 18-3. In FIG. 15, the intensity distribution of the irradiating coil 18-3 of the third embodiment is represented by the solid line, and the intensity distribution of the irradiating coil 18-1 of the second embodiment is represented by the broken line.

As shown in FIG. 15, a radio-frequency magnetic field is generated due to current flowing through the resonant capacitance elements 100 by distributing the resonant capacitance elements 100, whereby the irradiation intensity distribution on the line passing through the resonant capacitance elements 100 is more uniform.

As described above, according to the third embodiment of the present invention, the same effect as obtained by the second embodiment can be obtained. Further, a radio-frequency magnetic field is generated due to current transmitted to the resonant capacitance elements 100 by distributing the resonant capacitance elements 100, whereby the irradiation intensity distribution on the lines that pass through the resonant capacitance elements 100 can be made more uniform. Consequently, the overall irradiation intensity distribution can be more uniform.

Incidentally, in the third embodiment, two resonant capacitance elements 100 are connected between two adjacent line conductors 7. However, the number of the resonant capacitance elements 100 to be connected is not limited to two. As the number of the resonant capacitance elements 100 is larger, the irradiation intensity distribution can be further improved. The number of the resonant capacitance elements 100 can be suitably set depending on the length of the line conductors 7, the size of the resonant capacitance elements 100, and the like.

Figure 16:
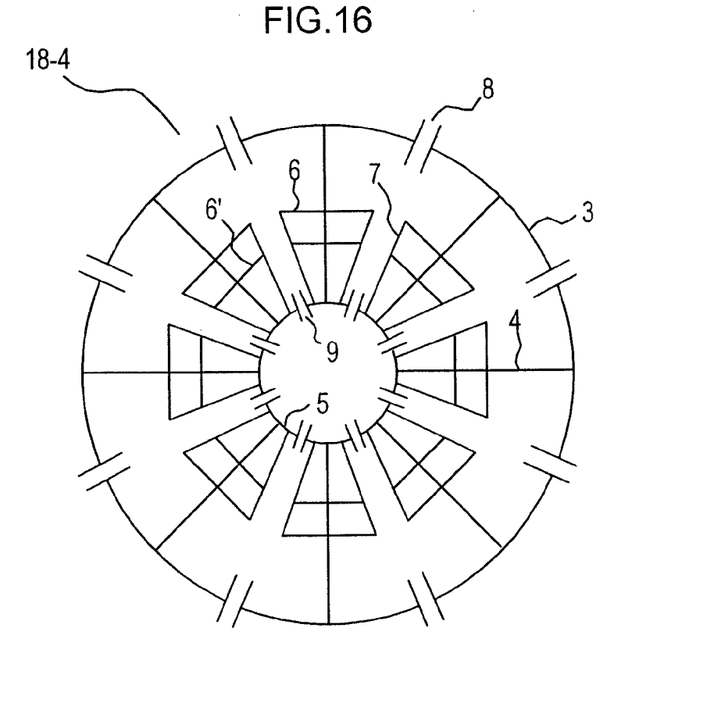
FIG. 16 is a schematic diagram of a planar birdcage coil according a fourth embodiment of the present invention.

Next, an irradiating coil 18-4, according to a fourth embodiment, will be described with reference to FIG. 16. In the fourth embodiment, the coil is constructed such that line conductors 6', which are perpendicular to the line conductors of the irradiating coil 18-1 according to the second embodiment and both ends of which are connected to the line conductors 7, are arranged between the line conductors 6 and the ring conductor 5.

By providing such a structure, the line conductors 6' can diverge current transmitted to the line conductors 4, whereby the uniformity of the irradiation intensity is further improved compared to that obtained in the second embodiment. Incidentally, in FIG. 16, one line conductor 6' is added to one line conductor 4. However, the number of the line conductor 6' is not limited to one, and two or more can be added. The current can be further diverged by increasing the number of the line conductors 6', whereby the uniformity of the irradiation intensity can be further improved.

Next, other embodiments of the irradiating coil according to the invention will be described with reference to FIGS. 17(A) to 17(C).

Figure 17:
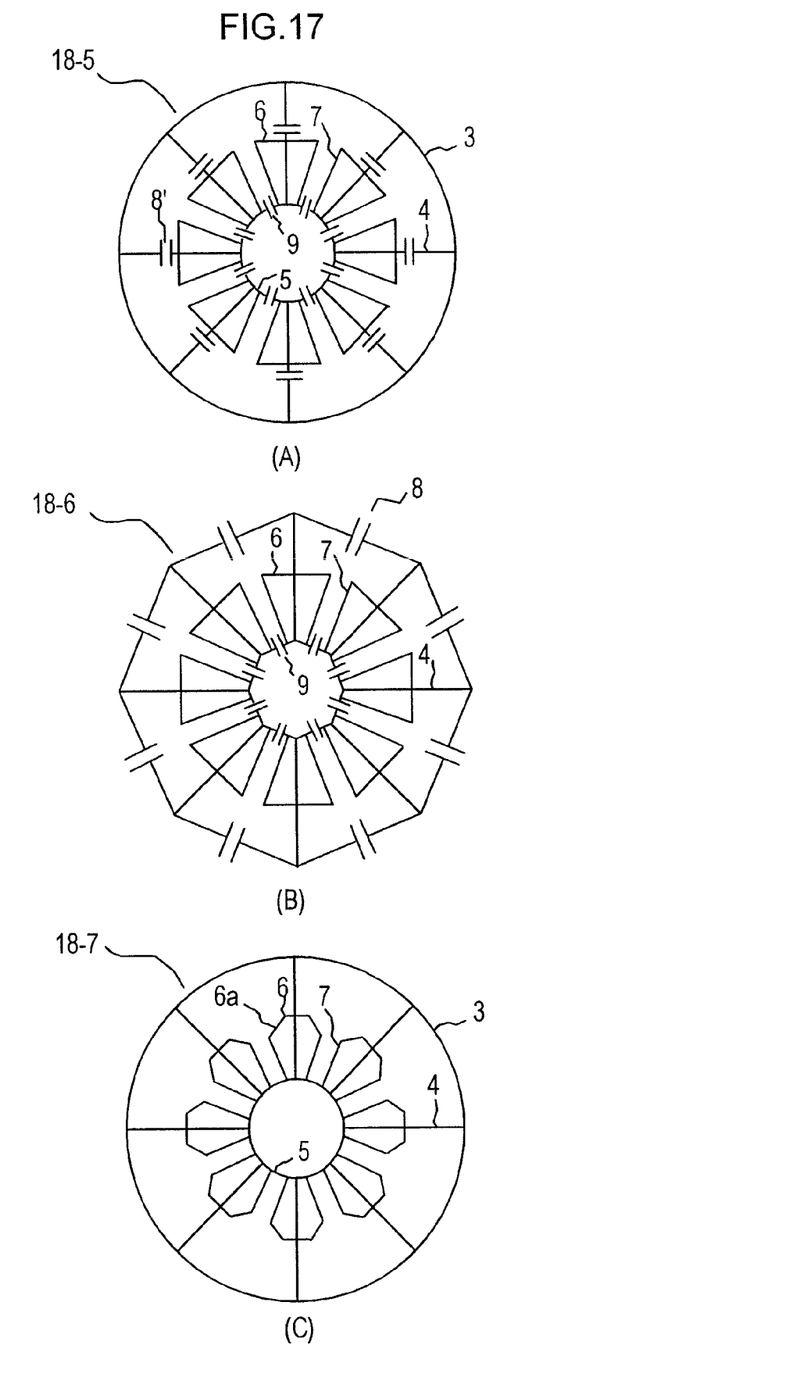
FIG. 17 is a schematic diagram of variations of planar birdcage coil according to other embodiments of the present invention.

First, an irradiating coil 18-5, as shown in FIG. 17(A), is constructed such that resonant capacitance elements 8' are arranged on the line conductors 4 instead of the resonant capacitance elements 8 of the irradiating coil 18-1 shown in FIG. 11, whereby the same effect as obtained by the resonant capacitance elements 8 and 9 can be obtained. Thus, the irradiation intensity can be made more uniform with a simpler structure.

Next, the irradiating coil 18-6 shown in FIG. 17(B) is constructed such that the shape of the ring conductors 3 and 5 of the irradiating coil 18-1 in FIG. 11 is that of a polygon, instead of a ring. That is, the shape of the ring conductors 3 and 5 constitutes a n-sided regular polygon (n is a multiple of four) in accordance with the number of the line conductors 4. In this manner, when the form of the irradiating coil is a polygon, the birdcage coil is manufactured by combining line conductors, and the conductors do not need to be made into a round shape, whereby the manufacturing becomes easier. When the irradiating coil 18-6 in FIG. 17(B) is used, the irradiation intensity can be made uniform in the same manner as the coil described in FIG. 11.

Incidentally, in accordance with the present invention, the term "ring conductors" includes conductors having a circular shape and conductors having a polygonal shape.

Next, an embodiment can be provided in which irradiating coil 18-7 in FIG. 17(C) is constructed such that the line conductors 6 of the irradiating coil 18-1 in FIG. 11 are shortened, and the line conductors 6a that connect the line conductors 6 and the line conductors 7 are provided.

In order to equalize the current to be diverged from the line conductors 4 to the line conductors 7 with the current remaining in the line conductors 4, and to thus cause a uniform radio-frequency magnetic field to be generated, the line conductors 6a for connecting the line conductors 6 and 7 may be provided, such that the length between the connecting point of the line conductors 4 and the line conductors 6 and the ring conductor 5, and the sum of half the length of the line conductor 6 and the length of the line conductors 7 are close to each other. This is done because the difference between the value of current transmitted to the line conductors 4 and that transmitted to the line conductors 7 becomes large when the difference between the length between the connecting point of the line conductors 4 to the conductors 6 and the ring conductor 5 and the sum of half the length of the line conductor 6 and the length of the line conductors 7 is large, since the conductors have a slight resistance.

The above-mentioned structure is designed to avoid such a phenomenon by making those two lengths close to each other, and to thus improve the uniformity of the irradiation intensity.

in this case, as one example of conditions for manipulating the line conductors 6, 6a, and 7 to be the same length as the line conductor 4, the angle made by the line conductor 6a and the line conductor 6 is no less than 90 degrees and is less than 180 degrees, and the angle made by the line conductor 6a and the line conductor 7 is also no less than 90 degrees and is less than 180 degrees. However, such a condition is not limited to this example.

Incidentally, while each of the above embodiments has described individually, combinations thereof may also be employed. For example, when combining the embodiment shown in FIG. 16 and the one shown in FIG. 17(B), the shape of the coil in FIG. 16 can be made into a polygon. When combining the embodiment shown in FIG. 9 and the one shown in FIG. 17(B), the shape of the coil in FIG. 9 can be made into a polygon.

In the above-described embodiments, the resonant capacitance elements (8 and 9) are provided to both the ring conductor 3 having a large diameter and to the ring conductor 5 having a small diameter. However, the resonant capacitance elements arranged on the ring conductor 5 having a smaller diameter may be omitted.

Further, the present invention is not limited to the above-described embodiments, and various changes may be made within the scope of the invention.

According to the present invention, a planar birdcage coil with a simple structure that can transmit a irradiation pulse uniformly can be realized. More specifically, the planar birdcage coil is constructed such that a plurality of resonant capacitance elements are serially arranged at positions where the potential of the birdcage coil is high. In this manner, fluctuation of the operating potential can be suppressed, and the potential fluctuation in response to external factors can be reduced.

In this manner, a potential shift due to a change of arrangement of the pre-amplifier and the distribution lines with respect to the planar birdcage coil can be reduced, and fluctuation of the radio-frequency coupling can be suppressed. Consequently, an irradiating coil that can reduce the proportion of the radio-frequency coupling between the irradiating coil and the distribution lines or the like, improve irradiation uniformity and irradiation efficiency, and obtain an image having good quality can be realized. Also, an MRI apparatus using this coil can be realized.

Further, since the coil is provided with line conductors and resonant capacitance elements for diverging the current to be transmitted to the line conductors, an irradiating coil (a birdcage coil) that can transmit a radio-frequency pulse uniformly in the area to be imaged can be realized. Also, an MRI apparatus in which the sensitivity of the image to be obtained is improved can be realized.

The invention claimed is:

1. An irradiating coil comprising:
    a first ring conductor located on a plane;
    a second ring conductor having a smaller diameter than a diameter of the first ring conductor and located substantially on the plane of the first ring conductor;
    a plurality of first line conductors connected to the first ring conductor and to the second ring conductor; and
    a plurality of resonant capacitive elements disposed on at least one of the first ring conductor, the second ring conductor, and at least one of the plurality of first line conductors; and
    a pulse uniformer configured to make uniform a radio-frequency-pulse that is transmitted by the irradiating coil;
    wherein the pulse uniformer includes diverging conductors configured to diverge a current flow of the first line conductors.

2. An irradiating coil according to claim 1, wherein both the first ring conductor and the second ring conductor each having the plurality of resonant capacitive elements arranged along the circumference thereof.

3. An irradiating coil according to claim 1, comprising a separate plurality of resonant capacitive elements arranged on the plurality of first line conductors.

4. An irradiating coil according to claim 1, wherein the plurality of resonant capacitive elements are arranged in a predetermined distribution pattern along the circumference of the at least one of the first ring conductor and the second ring conductor having the plurality of resonant capacitive elements arranged thereon.

5. An irradiating coil according to claim 1, wherein the diverging conductors includes at least one branch from the first line conductor to the second ring conductor.

6. An irradiating coil according to claim 5, wherein the branch is provided on both sides of each first line conductor.

7. An irradiating coil according to claim 5, wherein the branch is for bypassing a current flow between the first ring conductor and a connecting point of the first line conductor with the branch.

8. An irradiating coil according to claim 5, wherein the branch has a plurality of connecting points with the first line conductor.

9. An irradiating coil according to claim 5, wherein the branch has a second line conductor connected to the second ring conductor.

10. An irradiating coil according to claim 9, wherein each current flowing on the second line conductor and the first line conductor between the second ring conductor and a connecting point of the first line conductor with the branch is substantially a same current.

11. An irradiating coil according to claim 5, wherein two adjacent branches are disposed between two adjacent first line conductors and an electrically connected to each other via at least one resonant capacitor.

12. An irradiating coil according to claim 11, wherein the electrical connections between the branches and the resonant capacitors build up a circuit in a circumferential direction between the first ring conductor and the second ring conductor.

13. An MRI apparatus comprising:
    a static magnetic field generating unit configured to apply a static magnetic field to an object to be examined;
    a gradient magnetic field coil for applying to the object a slicing gradient magnetic field, a readout gradient magnetic field, and an encoding gradient magnetic field;
    an irradiating coil for applying to the object an irradiation pulse for generating magnetic resonance, including a first ring conductor located on a plane, a second ring conductor having a smaller diameter than a diameter of the first ring conductor and located substantially on the plane of the first ring conductor, and a plurality of first line conductors connecting the first ring conductor and the second ring conductor;
    a receiving coil for detecting a magnetic resonance signal; and
    an image reconstructing unit configured to obtain an image of the object using the signal detected by the receiving coil;
    wherein the irradiating coil includes a pulse uniformer configured to make the irradiation pulse uniform, and a plurality of resonant capacitive elements disposed on at least one of the first ring conductor, the second ring conductor, and at least one of the plurality of first line conductors; and
    wherein the pulse uniformer includes diverging conductors configured to diverge a current flow of the first line conductors.

14. An MRI apparatus according to claim 13, wherein the diverging conductors includes at least one branch from the first line conductor to the second ring conductor.

15. An MRI apparatus according to claim 13, wherein both the first ring conductor and the second ring conductor each having the plurality of resonant capacitive elements arranged along the circumference thereof.

16. An MRI apparatus according to claim 13, comprising a separate plurality of resonant capacitive elements arranged on the plurality of first line conductors.

17. An MRI apparatus according to claim 13, wherein the plurality of resonant capacitive elements are arranged in a predetermined distribution pattern along the circumference of the at least one of the first ring conductor and the second ring conductor having the plurality of resonant capacitive elements arranged thereon.

* * * * *